United States Patent
Lu et al.

(10) Patent No.: US 7,876,129 B2
(45) Date of Patent: Jan. 25, 2011

(54) LOAD SENSE AND ACTIVE NOISE REDUCTION FOR I/O CIRCUIT

(75) Inventors: Wei Ye Lu, Sunnyvale, CA (US); Elroy Lucero, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/234,922

(22) Filed: Sep. 22, 2008

(65) Prior Publication Data

US 2010/0052728 A1    Mar. 4, 2010

Related U.S. Application Data

(60) Provisional application No. 61/190,428, filed on Aug. 28, 2008.

(51) Int. Cl.
*H03K 19/0175* (2006.01)

(52) U.S. Cl. ............................... 326/82; 326/85; 326/68

(58) Field of Classification Search .................... 326/26, 326/27, 68, 80–85
See application file for complete search history.

(56) References Cited

U.S. PATENT DOCUMENTS

| | | | | |
|---|---|---|---|---|
| 5,218,239 A * | 6/1993 | Boomer | ........................ | 326/27 |
| 6,320,432 B1* | 11/2001 | Nagao | ........................ | 327/108 |
| 6,456,107 B1* | 9/2002 | Gauthier et al. | ................ | 326/27 |
| 6,724,224 B1* | 4/2004 | Li | ................ | 326/82 |
| 6,850,089 B2* | 2/2005 | Huang et al. | ................... | 326/26 |
| 7,420,395 B2* | 9/2008 | Kuramasu | ..................... | 326/83 |

* cited by examiner

*Primary Examiner*—Rexford N Barnie
*Assistant Examiner*—Crystal L Hammond
(74) *Attorney, Agent, or Firm*—Dergosits & Noah LLP

(57) ABSTRACT

An I/O circuit includes load sense and active noise reduction features that result in high speed output signal transitions with very low noise. Capacitive feedback control circuitry controls the point and time at which feedback capacitors are applied to the gate drive of the I/O circuit output stage. Active device feedback control controls the output stage gate drive.

4 Claims, 3 Drawing Sheets

LOAD SENSE AND ACTIVE NOISE REDUCTION FOR I/O CIRCUIT

PRIORITY CLAIM

This application claims the filing priority benefit of U.S. Provisional Application No. 61/190,428, filed on Aug. 28, 2008, and titled "Load Sense and Active Noise Reduction for I/O Circuit." Provisional Application No. 61/190,428 is hereby incorporated by reference herein in its entirety.

FIELD OF THE INVENTION

The present invention relates generally to integrated circuit (IC) devices and, in particular, to load sense and active noise reduction techniques for an input/output (I/O) circuit to provide high speed signal transition between a core circuit and a receiving load with very low noise.

DISCUSSION OF THE RELATED ART

Fast access time and low noise signal buffering is increasingly demanded in cutting edge digital and analog circuit designs. It is very important to smoothly transfer the signal from the core of a circuit to an interface with a receiving load circuit without a significant noise impact.

FIG. 1A shows a basic I/O circuit design 100 having an output stage that includes a PMOS driver transistor 102 and an NMOS driver transistor 104 connected to an output pad (PAD) 106. The logic value of the signal on the output pad 106 depends upon the logic value of the input signal D IN to the I/O circuit 100. That is, when the input signal DIN transitions from low to high, NAND gate 108 provides a logic low gate drive signal to the gate drive pull-up node PG to turn on PMOS driver transistor 102 and NOR gate 110 provides a logic low gate drive signal to gate drive pull-down node NG to hold NMOS driver transistor 104 off. In this state, the current flows from the circuit's voltage supply VDD I/O through PMOS driver transistor 102 to pull the output pad 106 to logic level that meets the "high" input threshold voltage level ViH of the receiving load. Similarly, when the input signal D IN transitions from high to low, NAND gate 108 provides a logic high gate drive signal to the pull-up node PG to hold PMOS driver transistor off and NOR gate 110 provides a logic high gate drive signal to the pull-down node NG to turn NMOS driver transistor on. In this state, the circuit's negative supply VSS I/O pulls the output pad 106 to a logic level that meets the "low" input threshold voltage level ViL of the receiving load.

Most (I/O) circuits of the type exemplified by the FIG. 1A circuit 100 are designed for worst case conditions to provide for high speed signal transition between the output of the I/O circuitry and the load input. As shown in FIG. 1B, although this "worst case" design is relatively fast, the signal transition speed is obtained at the cost of high noise levels.

FIG. 2A shows a known I/O circuit 200 that adds feedback capacitors 112, 114 connected to the output of the FIG. 1A conventional design. Feedback from the output pad to the relevant capacitor during signal transition, either from low to high or from high to low as discussed above, reduces the noise levels associated with a logic transition. As shown in FIG. 2B, however, the effect of the transition capacitors 112, 114 is to lower the noise levels of the low-to-high and high-to-low transitions, but at the cost of slowing down the low-to-high transition threshold edge ViH and the high-to-low transition edge ViL required to drive the load, thereby resulting in reduced system performance.

It would, therefore, be highly desirable to have available a load sense and active noise reduction technique for a generic I/O circuit that maintains the speed of the "worst case" design approach, but at very low noise levels.

SUMMARY OF THE INVENTION

The present invention provides feedback control for a capacitive feedback I/O circuit of the type discussed above with respect to FIGS. 2A and 2B. Capacitive feedback control circuitry controls the time and point at which the feedback capacitor is applied to the gate drive of the I/O circuit output stage. Active device feedback control circuitry controls the output stage gate drive. The addition of these control features provides a high speed I/O circuit, but with very low noise levels.

The features and advantages of the various aspects of the present invention will be more fully understood and appreciated upon consideration of the following detailed description of the invention and the accompanying drawings, which set forth an illustrative embodiment in which the concepts of the invention are utilized.

DETAILED DESCRIPTION OF THE INVENTION

Figure 2A:
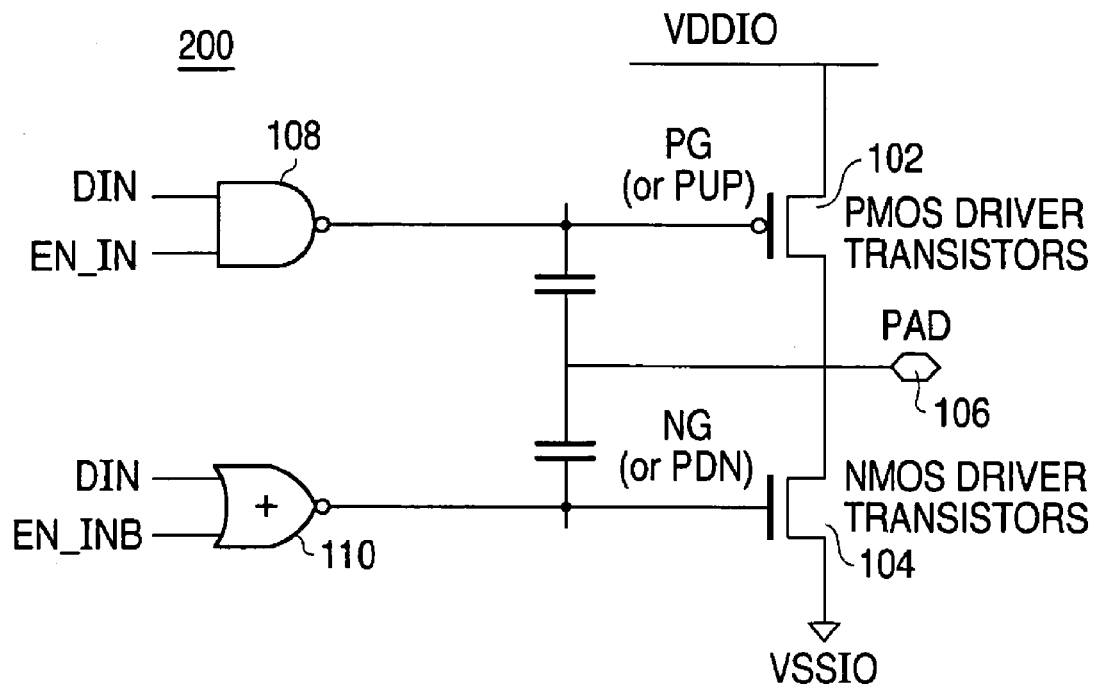
FIG. 2A is logic block diagram illustrating an I/O circuit of the type shown in FIG. 1A with the addition of feedback capacitors.
Figure 2B:
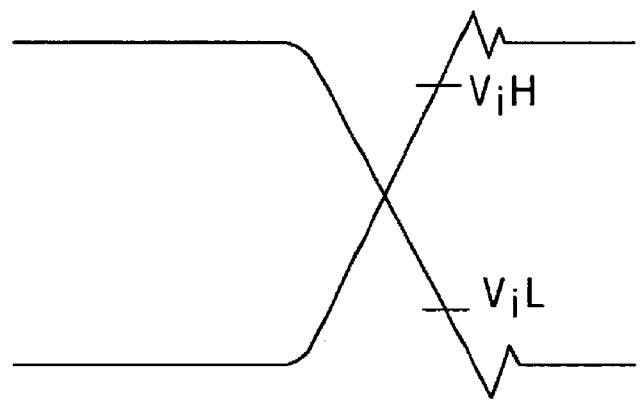
FIG. 2B is a waveform diagram illustrating the speed and noise associated with the FIG. 2A circuit relative to the FIG. 1A I/O circuit.
Figure 3A:
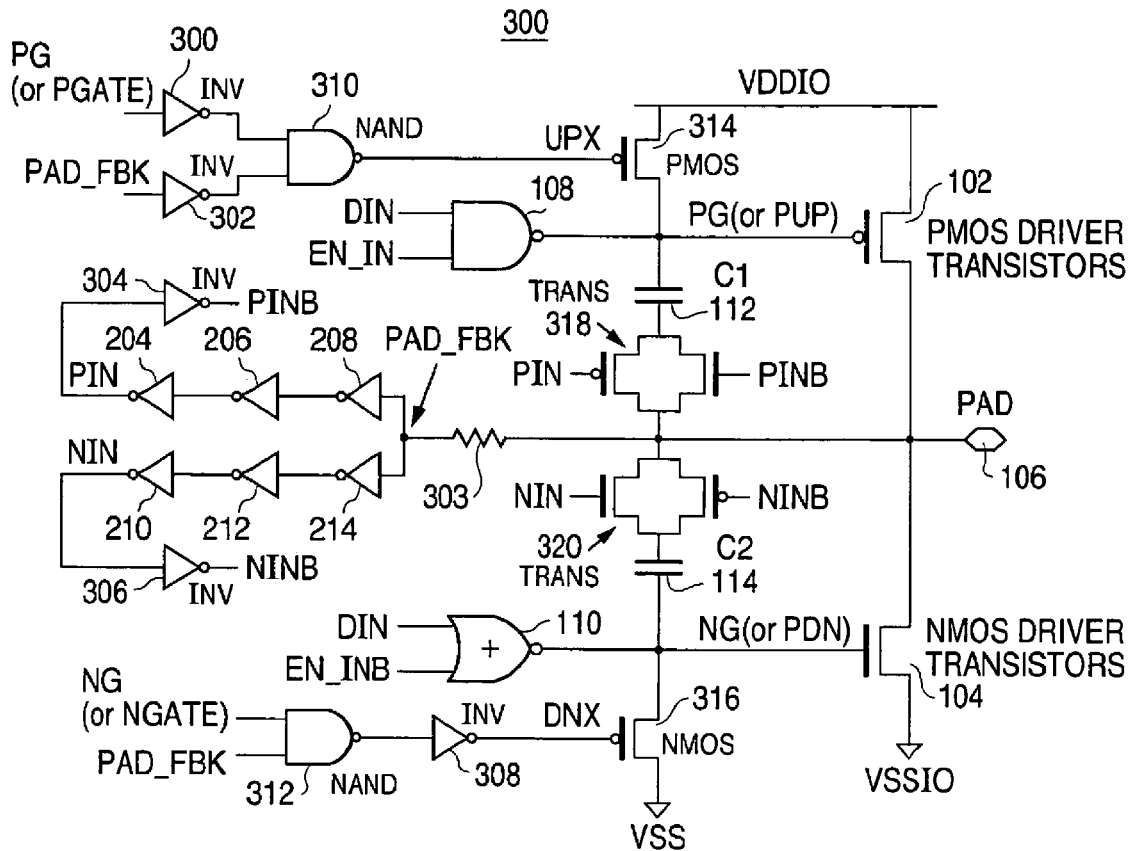
FIG. 3A is a logic block diagram illustrating an I/O circuit in accordance with the concepts of the present invention.

FIG. 3A shows an I/O circuit 300 in which a low voltage data signal from the core circuit has amplified and stabilized and the lower voltage VDD level signal from the core circuit is level-shifted to high voltage VDDIO level and sent to a pre-driver NAND 108 and a pre-driver NOR gate 110, which combine an enable control signal from another level-shifter to provide the logic functions for the PMOS driver transistor 102 and the NMOS driver transistor 104. FIG. 3A also shows the feedback capacitors 112, 114 of the FIG. 2A design.

As discussed above during driver pull-up time, the pre-driver NAND gate 108 usually provides a high-to-low pulse to turn on the gate of PMOS driver transistor 102 to allow the power supply VDDIO to charge the input/output pad (PAD) 106 to logic high. During driver pull-down time, the pre-driver NOR gate 110 usually provides a low-to-high pulse to turn on the gate of NMOS driver transistor 104 to allow the input/output pad (PAD) 106 to discharge to logic low. As further discussed above, the core signal voltage and current level have been changed when the signal pass through I/O; the core signal voltage is changed from VDD to VDDIO and the current level may be amplified many times from its original level, for example, the 0.5 mA to 16 mA.

The PMOS driver transistor 102 and the NMOS driver transistor 104 are typically large-sized devices so that they can amplify the current from the pre-driver stage. One of the proper ways to control the output noise of the buffer (or driver) is to manage the gate voltages of the driver transistors 102, 104 in order to control the behavior of the current conducted into the driver transistors. The control facts are (1) determine how and when to turn off the gate of the driver transistors 102 (or 104) after it has been turned on and (2) determine how long and in what voltage level to allow driver transistor 102 (104) to maintain its on state.

In accordance with one aspect of the present invention, a current with opposite direction is provided to the major pull-up/down current from the pre-driver stage. More specifically, when pre-driver NAND gate 108 starts a pull-down current to discharge the pull-up node PG node at T1, after a certain delay (a delta-T), at time T2, NAND gate 310 causes PMOS transistor 314 to introduce a small opposite current to the same pull-up node PG, which is the gate of PMOS driver transistor 102, to charge the PG node a small amount to prevent the PG node from being pulled down further. The gate voltage of pull-up PMOS driver transistor 102 is not close to zero at a short period of time, say from time T2 to T3, which weakens the pull up current flow in the PMOS driver transistor 102.

Similarly, when the pre-driver NOR gate 110 generates a voltage to charge the pull-down node NG, which is the gate of NMOS driver transistor 104, at time T4, after a certain delay (a delta-T), say at time T5, a small opposite current created by NAND gate 312 acts on the pull-down node NG to discharge the NG node a small to prevent the NG node from being pulled up further so that the gate voltage of the NMOS driver transistor 104 is not fully charged to power supply level in a short period of time, say from tie T5 to T6, which will weaken the pull-down current in the NMOS driver transistor 104.

The current from the NAND gate 310 and NAND gate 312 not only weakens the current flow, but also smooths the change rate of the current in the PMOS drive transistor 102 and the NMOS driver transistor 104, respectively. Since the feedback devices have a certain relationship with the load of the PAD, they may sense charge and discharge slope (or speed) of the load and negatively feed the signal back to the PG node and the NG node to adjust the voltage level and turn on time of the gates of PMOS driver transistor 102 and the NMOS driver transistors 104. For example, if the rising or falling slope of PAD 106 is very sharp, when close to the end of rising or falling edge, the current conducted in the PMOS drive transistor 102 or the NMOS driver transistor 104 may cause significant noise impact such as overshoot and supply voltage droop, undershoot and ground bounce. In this situation, the circuitry added in accordance with the concepts of the invention provides a negative feedback to the pre-driver to prevent the sudden change of the gate voltage of PMOS driver transistor 102 or the NMOS driver transistor 104 through PMOS transistor 314 or NMOS transistor 316 so that the driving strength of the driver is weakened during times T2-T3 and T5-T6, as discussed above.

Newly added devices in the FIG. 3A circuit 300 over the FIG. 2A circuit 200 include transmission gates 318 and 320, inverters 300, 302, 304, 306 and 308, PMOS transistor 314, NMOS transistor 316, and resistor 303. As further shown in FIG. 3A, the PAD 106 is also linked to the gate of a first inverter chain (204, 206, 208) and to the gate of a second inverter chain (212, 214, 216) through a transmission gate not shown in FIG. 3A. The output PIN of the first inverter chain (204, 206, 208) is connected to inverter 304). The output PINB of inverter 304 is tied to transmission gate 318 which is connected between capacitor 112 and PAD 106. The output NINB of the second inverter chain (212, 214, 216) is tied to transmission gate 320 which is connected between capacitor 114 and PAD 105.

The function of transmission gate 318 is to allow capacitor 112 to be charged closer to the end of the PAD rising edge. At beginning of the PAD rising edge, transmission gate 318 is turned off and capacitor 112 has no impact. The function of transmission gate 320 is to allow capacitor 114 to be charged closer to the end of the PAD falling edge. At beginning of the PAD falling edge, transmission gate 320 is turned off and capacitor 114 has no impact. As a result, the rising and falling edges are smooth closer to the end of their edges because the transmission gates and capacitors are installed between the driver node and PAD. An inverse signal of PG and PAD_FBK is fed into NAND gate 310.

Thus, the present invention provides capacitive feedback control circuitry that enables/disables the time and point at which feedback the feedback capacitors 112 and 114 are applied to the gate drive of the output transistors 102 and 104, respectively. For the pull-up node PG the time is controlled by the delay provided by inverter chain 204, 206, 208, 304; the point is controlled by the P/N of inverter 208. For the pull-down node NG, the time is controlled by the inverter chain 210, 212, 214, 306; the point is controlled by the P/N of inverter 214.

The logic effect PAD pull-up is as follows: (1) when drive node PG is high and PAD 106 is low, the output of NAND gate 310 is high and PMOS transistor 314 is off; (2) when driver node PG is low and PAD 106 is low at the same time, the output of NAND gate 310 is low, PMOS transistor 314 is on and a small current is charging up the pull-up node PG (i.e. the gate of PMOS driver transistor !02), while the pull-up node PG is still in pulling down time. This prevents the gate of PMOS transistor 102 from being pulled down further to zero so that the voltage of PMOS transistor 102 is higher than zero, but low enough to keep the device in an "on" state. The current flowing into PMOS transistor 102 is limited by its gate voltage behavior; (3) when driver node PG is low and PAD 106 is high, the output of NAND gate 310 goes back to high to turn off PMOS transistor 314 at the end of driver pull up period. During the driver pull up time, PMOS transistor will create a high-low-high pulse to turn on PMOS transistor 314 in a short period of time.

The logic affect PAD pull-down is as follows: (1) when node NG is low and PAD 106 is high, the output of NAND gate 312 is high and the output of inverter 308 is low, causing NMOS transistor 316 to be off; (2) when node NG is high and PAD 106 is high, the output of NAND gate 312 is low and the output of inverter 308 is high, causing NMOS transistor 316 to be turned on; (3) when node NG is high and PAD 106 is low, the output of NAND gate 312 is high and the output of inverter 308 is low, causing NMOS transistor 316 to be turned off. This creates a low-high-low pulse in the gate of NMOS driver transistor 104 during driver pull down time, which will build up a small current to discharge the gate of NMOS transistor 104 to prevent the gate voltage from being pulled up further, which also limits the current flowing into NMOS transistor 104 but still maintains its "on" state.

Figure 1A:
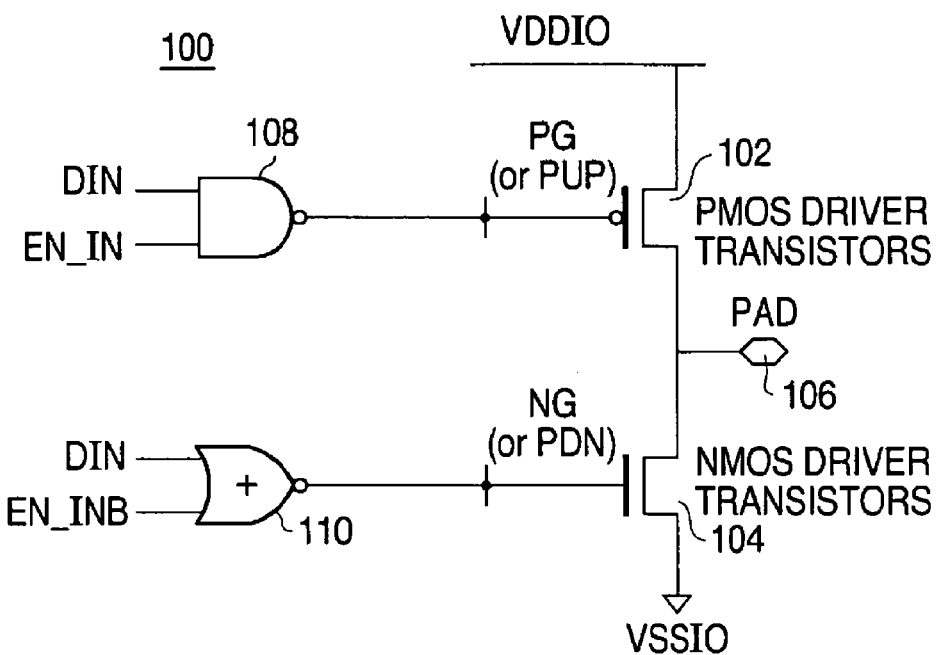
FIG. 1A is logic block diagram illustrating a basic I/O circuit design.
Figure 1B:
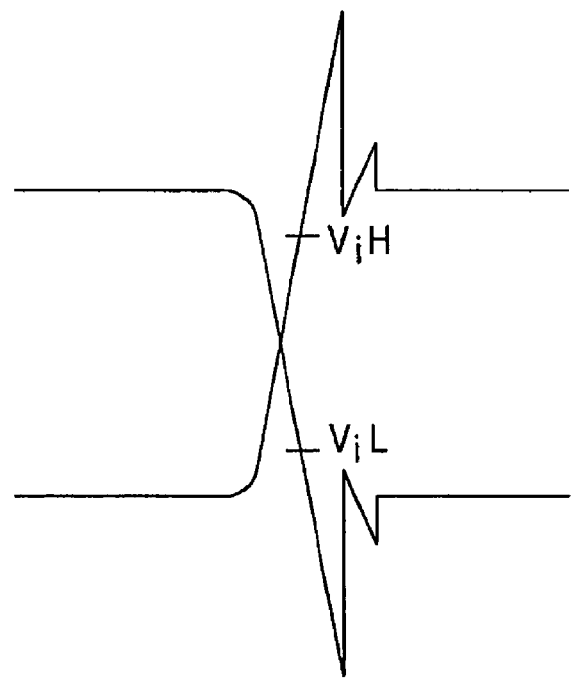
FIG. 1B is a waveform diagram illustrating the signal transition speed and noise associated with the FIG. 1A I/O circuit.
Figure 3B:
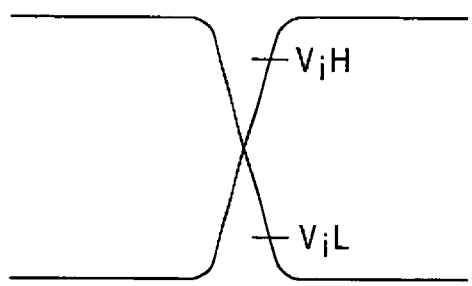
FIG. 3B is a waveform diagram illustrating the speed and noise associated with the FIG. 3A circuit relative to the FIG. 1A I/O circuit and the FIG. 2A I/O circuit.

FIG. 3B shows that the FIG. 3A circuit 300 results in the high speed signal transition associated with the FIG. 1A circuit, but at greatly reduced noise levels.

Those skilled in the art will appreciate that remainder of the FIG. 3A I/O consists of very common components found in many I/O circuits (see FIG. 2A, for example) such as a level-shifter, weak pull-up/down devices and a receiver (or load). As discussed above, the level-shifter is to shift the VDD lower voltage core signal to VDDIO, the high voltage signal, and then provide the VDDIO level signals to the driver and I/O interface. The weak pull-up/down devices provide an option to set a certain state (a weak high-to-low) to the PAD 106 when the driver is disabled and PAD is in "z" state.

It should be understood that the particular embodiments of the invention described above have been provided by way of example and that other modifications may occur to those skilled in the art without departing from the scope and spirit of the invention as express in the appended claims and their equivalents. For example, those skilled in the art will appreciate that the feature sizes and thicknesses of the SOI layer, the upper surface isolation trench and the backside isolation will depend upon a particular IC application and the characteristics of the high voltage circuitry and the low voltage circuitry.

What is claimed is:

1. An input/output (I/O) circuit having an output stage that includes a PMOS driver transistor connected between a positive supply voltage and an output node, the PMOS driver transistor having a gate electrode connected to a pull-up node, and an NMOS driver transistor connected between a negative supply voltage and the output node, the NMOS driver transistor having a gate electrode connected to a pull-down node, the I/O circuitry further comprising:
    first pre-driver circuitry connected directly to the pull-up node for providing a P-gate drive signal to the gate electrode of the PMOS driver transistor;
    second pre-driver circuitry connected directly to the pull-down node for providing an N-gate drive signal to the gate electrode of the NMOS driver transistor;
    a first feedback capacitor connected between the pull-up node and the output node;
    a second feedback capacitor connected between the pull-down node and the output node;
    capacitive feedback control circuitry connected between the output pad and the first and second feedback capacitors for controlling the time and voltage level at which the first and second feedback capacitors are applied to the pull-up and pull-down nodes, respectively the capacitive feedback control circuitry comprising
        first active feedback control circuitry connected between the output node and the pull-up node for controlling the P-gate drive signal;
        and second active feedback control circuitry connected between the output node and the pull-down node for controlling the N-gate drive signal;
    a first transmission gate connected between the first feedback capacitor and the output node;
    a first series of inverters connected to the first transmission gate for controlling the first transmission gate;
    a second transmission gate connected between the second feedback capacitor and the output node; and
    a second series of inverters connected to the second transmission gate for controlling the second transmission gate.

2. The I/O circuit of claim 1, further comprising:
    a resistor connected between the output node, the first series of inverters and the second series of inverters.

3. The I/O circuit of claim 2, wherein the first active feedback control circuitry comprises:
    a PMOS feedback control transistor connected between the positive supply voltage and the pull-up node, the PMOS feedback control transistor having a gate electrode;
    a resistor connected to the output node;
    a first NAND gate having an output node connected to the gate electrode of the PMOS feedback control transistor, a first input node connected to the pull-up node via a first input node inverter and a second input node connected between the resistor and the first series of inverters via a second input node inverter.

4. The I/O circuit of claim 3, wherein the second active feedback control circuitry comprises:
    an NMOS feedback control transistor connected between the negative supply voltage and the pull-down node, the NMOS feedback control transistor having a gate electrode;
    an NMOS feedback control inverter having an input node and an output node connected to the gate electrode of the NMOS feedback control resistor transistor;
    a second NAND gate having an output node connected to the input node of the NMOS feedback control inverter, a first input node connected to the pull-down node, and a second input node connected between the resistor and the second series of inverters.

* * * * *